United States Patent
Shoeb et al.

(10) Patent No.: US 12,057,319 B2
(45) Date of Patent: Aug. 6, 2024

(54) SELECTIVE SILICON DIOXIDE REMOVAL USING LOW PRESSURE LOW BIAS DEUTERIUM PLASMA

(71) Applicant: Lam Research Corporation, Fremont, CA (US)

(72) Inventors: Juline Shoeb, Fremont, CA (US); Alexander Paterson, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 316 days.

(21) Appl. No.: 17/438,884

(22) PCT Filed: Mar. 12, 2020

(86) PCT No.: PCT/US2020/022445
§ 371 (c)(1),
(2) Date: Sep. 13, 2021

(87) PCT Pub. No.: WO2020/186087
PCT Pub. Date: Sep. 17, 2020

(65) Prior Publication Data
US 2022/0148852 A1    May 12, 2022

(51) Int. Cl.
| | |
|---|---|
| *H01L 21/311* | (2006.01) |
| *H01J 37/32* | (2006.01) |
| *H01L 21/02* | (2006.01) |
| *H01L 21/30* | (2006.01) |

(52) U.S. Cl.
CPC ...... *H01L 21/31116* (2013.01); *H01J 37/321* (2013.01); *H01L 21/02164* (2013.01); *H01L 21/3003* (2013.01); *H01L 21/31105* (2013.01); *H01L 21/31111* (2013.01); *H01J 37/32715* (2013.01); *H01J 2237/2007* (2013.01); *H01J 2237/334* (2013.01)

(58) Field of Classification Search
None
See application file for complete search history.

(56) References Cited

U.S. PATENT DOCUMENTS

| | | | |
|---|---|---|---|
| 7,951,683 B1 * | 5/2011 | Shanker | H01L 21/31116 257/E21.546 |
| 2007/0056925 A1 | 3/2007 | Liu et al. | |
| 2007/0123012 A1 | 5/2007 | Walther et al. | |
| (Continued) | | | |

OTHER PUBLICATIONS

L.G. Christophorou and J.K. Olthoff, "Fundamental Electron Interactions with Plasma Processing Gases", published by Springer Science+Business Media, Chapter 1. (Year: 2004).*

(Continued)

*Primary Examiner* — Jiong-Ping Lu
(74) *Attorney, Agent, or Firm* — PENILLA IP, APC

(57) ABSTRACT

A method is provided, including the following method operations: generating a deuterium plasma, the deuterium plasma including a plurality of energetic deuterium atoms; and directing one or more of the plurality of energetic deuterium atoms to a surface of a substrate, the surface of the substrate having a region of silicon dioxide, the region of silicon dioxide having an underlying silicon layer; wherein the one or more of the plurality of energetic deuterium atoms selectively etch the region of silicon oxide, to the exclusion of the underlying silicon layer.

13 Claims, 6 Drawing Sheets

(56) References Cited

U.S. PATENT DOCUMENTS

2010/0055921 A1     3/2010   Mitchell et al.
2012/0094466 A1     4/2012   Ng et al.

OTHER PUBLICATIONS

A. Grill, "Cold Plasma in Materials Fabrication", published by IEEE Press, Chapter 1. (Year: 1994).*
ISR & Written Opinion PCT/US2020/022445, dated Jul. 2, 2020, 11 pages.

* cited by examiner

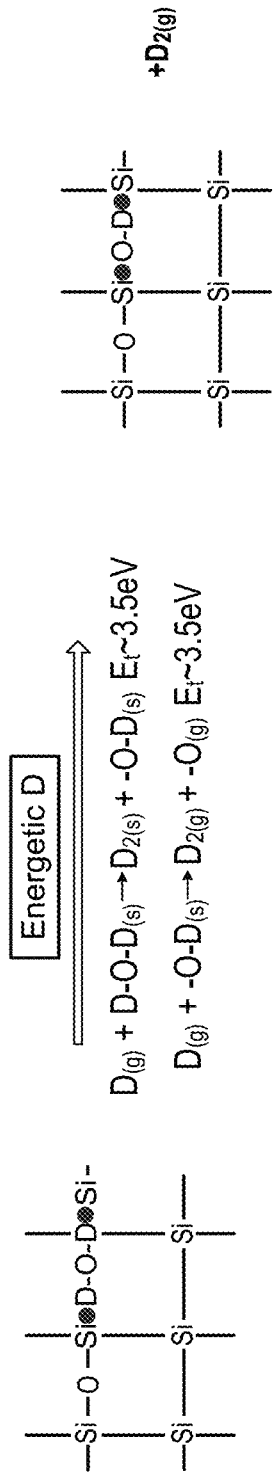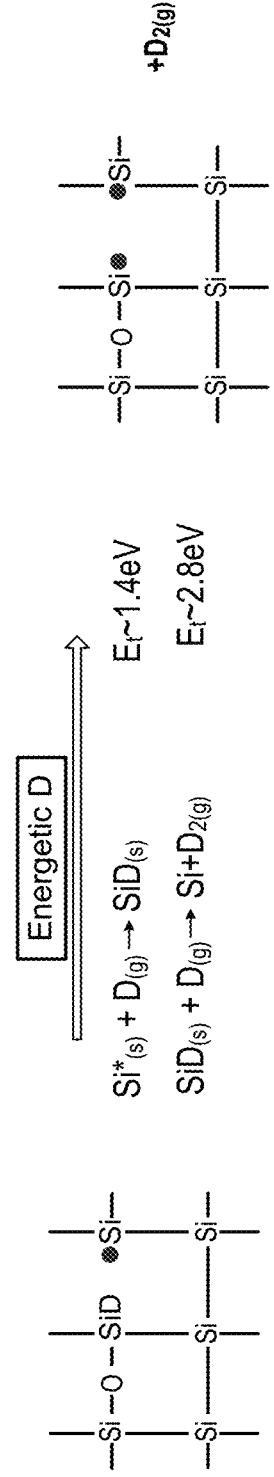

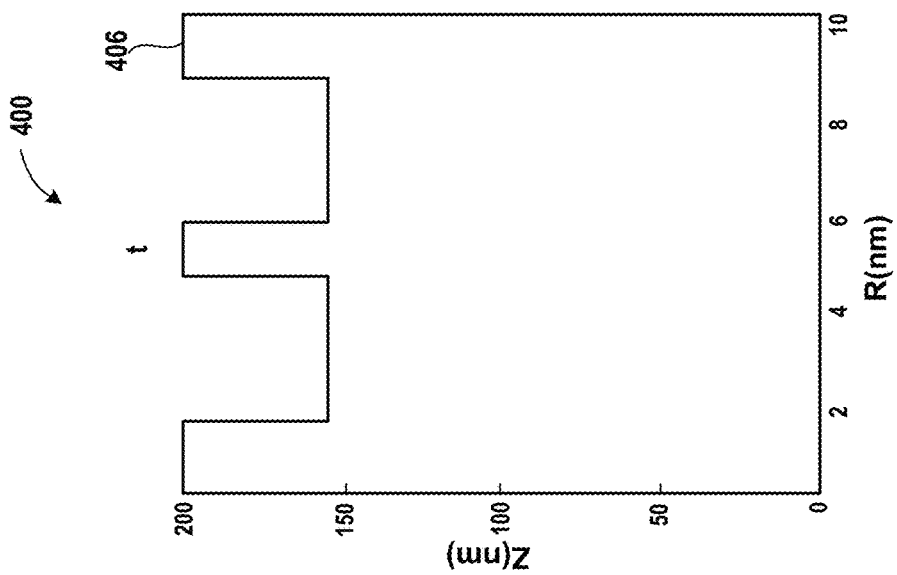
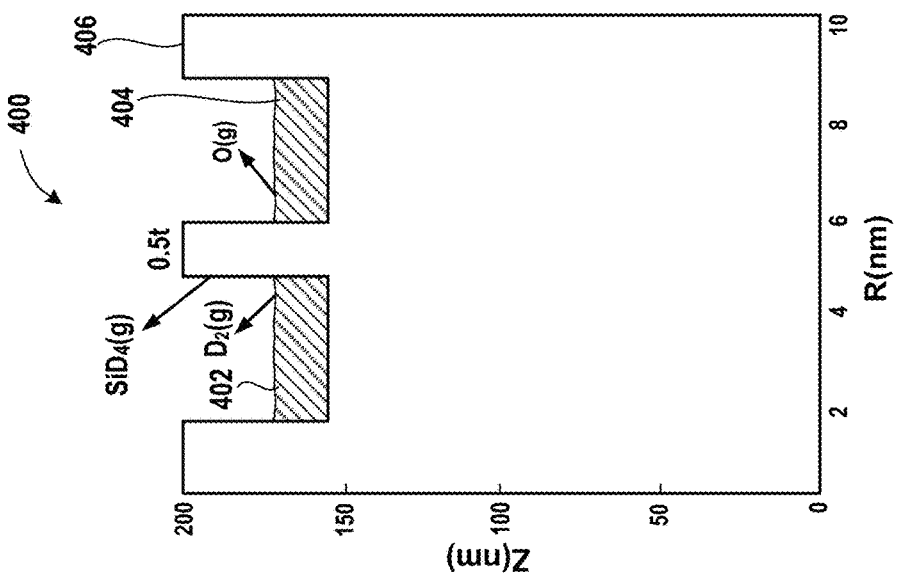
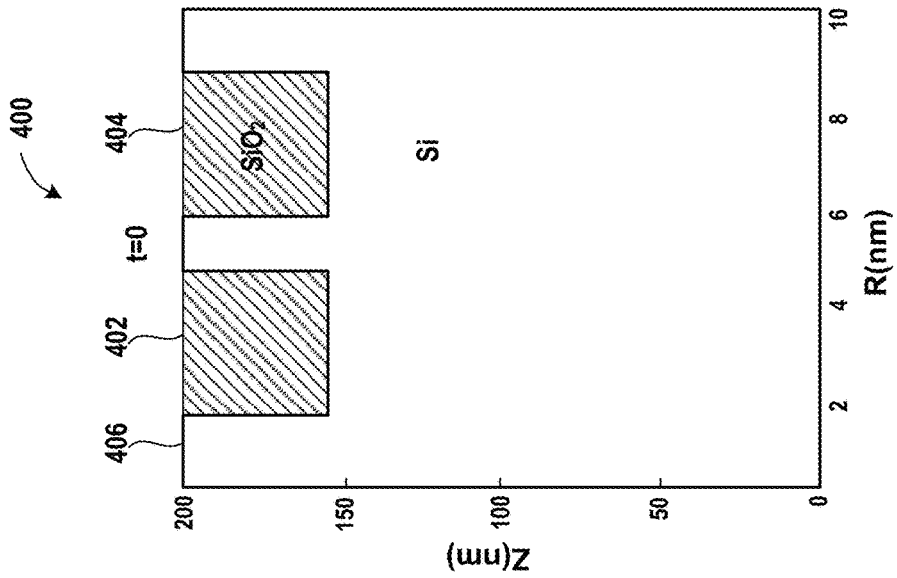

SELECTIVE SILICON DIOXIDE REMOVAL USING LOW PRESSURE LOW BIAS DEUTERIUM PLASMA

CLAIM OF PRIORITY

This application is a national stage filing of and claims priority, under 35 U.S.C. § 371, to PCT/US2020/022445, filed on Mar. 12, 2020, and titled "SELECTIVE SILICON DIOXIDE REMOVAL USING LOW PRESSURE LOW BIAS DEUTERIUM PLASMA", which is incorporated by reference herein in its entirety.

FIELD OF THE INVENTION

Implementations of the present disclosure relate to removal of silicon dioxide on top of silicon selectively using low pressure low bias deuterium plasmas.

DESCRIPTION OF THE RELATED ART

As technology continues to progress and greater electronic device performance is sought, so the feature sizes of semiconductor devices continues to shrink. In coming years, future process technology nodes are contemplated to be at or below about 5 nm. However, at such feature sizes, the dimensions are nearing the atomic level.

For example, a single $SiO_2$ (silicon dioxide) molecule is roughly 0.3 nm in diameter, so at a 3 nm process technology node, there may be only about 10 molecules thickness of $SiO_2$ in a 3 nm feature. Thus, as feature dimensions are progressing towards the atomic level, etching processes will need to be extremely precise, as there will not be much latitude with respect to material being preserved or etched. There may be only about 10 monolayers of SiO2 in a 3 nm feature, and this may need to be precisely etched while preserving the underlying material (e.g. a silicon underlying layer).

There are several scenarios where it is desirable to selectively etch $SiO_2$ while preserving underlying silicon. For example, in a fin field-effect transistor (FinFET), the gate structure may include a layer of hafnium dioxide (e.g. about 1.5 nm thickness), over a layer of silicon dioxide (e.g. of about 0.5 nm thickness), over a silicon fin. With a silicon dioxide thickness of just 0.5 nm, there may be only two layers of silicon, and thus it is important to be able to selectively etch the $SiO_2$ while protecting the underlying silicon fin. Such an etch process needs to be able to stop when the underlying silicon is reached.

As another example, in the formation of a shallow trench insulator (STI), there may be silicon and silicon dioxide portions. Again, when processing it can be desirable to protect silicon during etching of silicon dioxide, and stop etching at silicon. Thus, a challenge facing the industry in moving to a 5 nm or less (e.g. 3 nm) process node, is how to enable etching of silicon dioxide while protecting silicon, for very small features. The selectivity of the etching process needs to be very high.

Current technologies for removal of $SiO_2$ above Si may employ fluorocarbon chemistry (e.g. $C_xF_y$ type plasma chemistries such as $C_4F_8$ plasma) that produce $SiF_4$ and $COF_2$. However, such processes produce large quantities of polymers (e.g. $SiC_xF_y$). While these polymers may protect silicon by forming a passivation layer, they are not ideal because they add a couple of monolayers on the surface. Furthermore, fluorocarbon-based plasma processes typically require high energy to remove $SiO_2$. This means that while they may effectively remove $SiO_2$, the high energy renders them prone to removing the underlying Si as well. Thus, current technologies of this type are not suitable for future (e.g. 3 nm) technology nodes.

It is in this context that implementations of the disclosure arise.

SUMMARY

Implementations of the present disclosure include methods and systems for removal of silicon dioxide on top of silicon selectively using low pressure low bias deuterium plasmas.

In some implementations, a method is provided, including the following method operations: generating a deuterium plasma, wherein generating the deuterium plasma is configured to generate energetic deuterium atoms; applying the deuterium plasma to a surface of a substrate, the surface of the substrate having a region of silicon dioxide, the region of silicon dioxide having an underlying silicon layer; wherein the energetic deuterium atoms of the deuterium plasma are configured to selectively etch the region of silicon oxide, to the exclusion of the underlying silicon layer.

In some implementations, at least some of the energetic deuterium atoms are generated from vibrational excitation during electron impact in the deuterium plasma.

In some implementations, at least some of the energetic deuterium atoms are generated from charge exchange collisions in the deuterium plasma.

In some implementations, the energetic deuterium atoms are generated with approximately 0.15 eV to 30 eV energy.

In some implementations, generating the deuterium plasma includes introducing a deuterium gas into a process chamber in which the substrate is disposed, and inductively coupling power into the deuterium gas in the process chamber.

In some implementations, generating and applying the deuterium plasma is performed in the process chamber at a pressure of approximately 1 to 50 mTorr.

In some implementations, inductively coupling power into the deuterium gas in the process chamber includes applying power to an RF coil at approximately 50 to 5000 Watts.

In some implementations, applying the deuterium plasma to the surface of the substrate includes applying a bias power of approximately 5 to 100 Watts.

In some implementations, a method is provided, including the following method operations: generating a deuterium plasma, wherein generating the deuterium plasma is configured to generate energetic deuterium atoms; applying the deuterium plasma to a surface of a substrate, the surface of the substrate having a region of silicon dioxide, the region of silicon dioxide having an underlying silicon layer; wherein applying the deuterium plasma to the surface of the substrate includes applying a bias power of approximately 5 to 100 Watts; wherein generating and applying the deuterium plasma is performed in the process chamber at a pressure of approximately 1 to 50 mTorr; wherein the energetic deuterium atoms of the deuterium plasma are configured to selectively etch the region of silicon oxide, to the exclusion of the underlying silicon layer.

In some implementations, the energetic deuterium atoms are generated from vibrational excitation during electron impact or charge exchange collisions in the deuterium plasma.

In some implementations, the energetic deuterium atoms are generated with approximately 0.15 eV to 30 eV energy, In some implementations, generating the deuterium plasma includes introducing a deuterium gas into a process chamber in which the substrate is disposed, and inductively coupling power into the deuterium gas in the process chamber.

In some implementations, inductively coupling power into the deuterium gas in the process chamber includes applying power to an RF coil at approximately 50 to 5000 Watts.

In some implementations, a system is provided, including the following: a process chamber, the process chamber configured to receive a substrate for processing, a surface of the substrate having a region of silicon dioxide, the region of silicon dioxide having an underlying silicon layer; a deuterium source for supplying a deuterium gas into the process chamber; an RF coil for inductively coupling power into the deuterium gas in the process chamber, to generate a deuterium plasma, wherein the deuterium plasma is configured to generate energetic deuterium atoms; wherein the deuterium plasma is applied to the surface of the substrate, wherein the energetic deuterium atoms of the deuterium plasma are configured to selectively etch the region of silicon oxide, to the exclusion of the underlying silicon layer.

In some implementations, at least some of the energetic deuterium atoms are generated from vibrational excitation during electron impact in the deuterium plasma.

In some implementations, at least some of the energetic deuterium atoms are generated from charge exchange collisions in the deuterium plasma.

In some implementations, the energetic deuterium atoms are generated with 0.15 eV to 30 eV energy.

In some implementations, the system further includes, a vacuum source configured to maintain the process chamber at a pressure of approximately 1 to 50 mTorr.

In some implementations, the system further includes, an RF power source configured to apply RF power to the RF coil at approximately 50 to 5000 Watts.

In some implementations, the system further includes, a chuck, disposed in the process chamber and configured to support the substrate; an RF power source configured to apply a bias power to the chuck of approximately 5 to 100 Watts.

It will be appreciated that the foregoing represents a summary of certain non-limiting implementations of the disclosure. Additional implementations will be apparent to those skilled in the art in accordance with the scope of the present disclosure.

BRIEF DESCRIPTION OF THE DRAWINGS

FIGS. 3A, 3B, 3C, and 3D conceptually illustrate a series of reactions through which energetic deuterium achieves etching of the surface of a substrate, in accordance with implementations of the disclosure.

FIGS. 4A, 4B, and 4C conceptually illustrate selective etching of $SiO_2$ from a substrate surface, in accordance with implementations of the disclosure.

DETAILED DESCRIPTION

Figure 1:
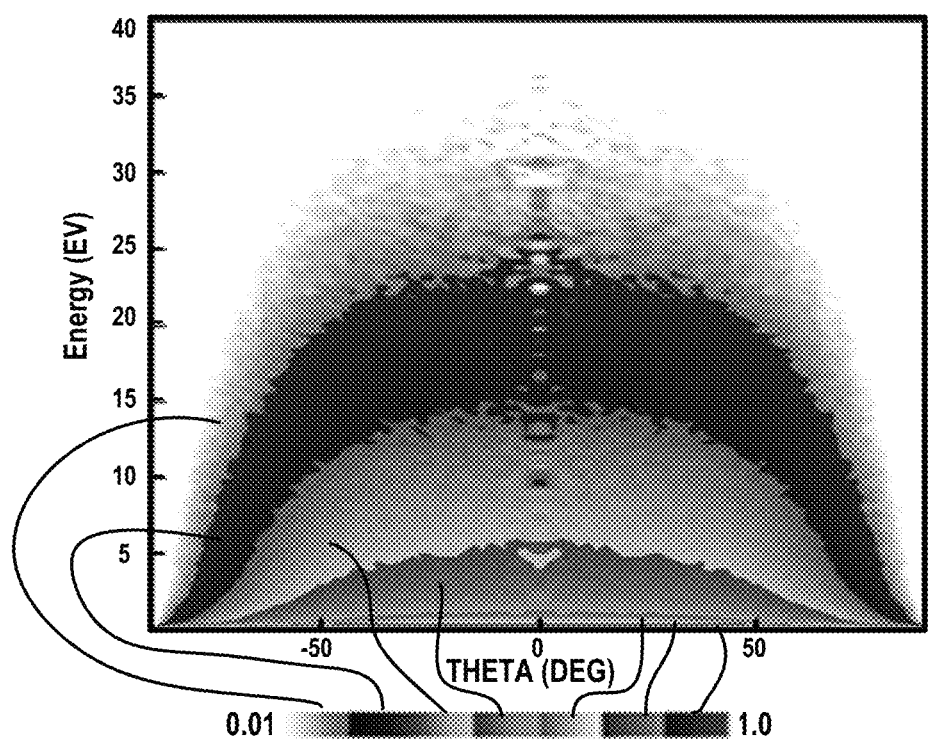
FIG. 1 is a graph conceptually illustrating potential energy versus intermolecular distance for a deuterium molecule $D_2$.

In the following description, numerous specific details are set forth to provide a thorough understanding of the presented implementations. The disclosed implementations may be practiced without some or all of these specific details. In other instances, well-known process operations have not been described in detail to not unnecessarily obscure the disclosed implementations. While the disclosed implementations will be described in conjunction with the specific implementations, it will be understood that it is not intended to limit the disclosed implementations.

Implementations of the disclosure provide methods and systems for selective removal of silicon dioxide ($SiO_2$) while protecting an underlying silicon (Si) layer.

Implementations of the disclosure provide methods and systems for selective removal of silicon dioxide ($SiO_2$) while protecting an underlying silicon (Si) layer. Broadly speaking, a deuterium ($D_2$) plasma is employed, in which vibrational excitation and Franck-Condon heating produce energetic deuterium (D) atoms capable of forming bonds with oxygen (O) and releasing volatile O and $D_2$. Deuterium atoms also form Si-D bonds; however another energetic deuterium atom can release the deuterium from a Si-D bond leaving solid silicon unaffected and producing deuterium ($D_2$) gas.

Energetic deuterium can be generated because of vibrational excitation during electron impact of $D_2$ in a low pressure $D_2$ plasma that leads to separation of 2 deuterium atoms that gain equal energy from an excited $D_2$ molecule in accordance with the Franck-Condon principle. Deuterium atoms may also gain energy from charge exchange collisions in the $D_2$ plasma. Mechanisms for energetic deuterium atom generation are described in further detail below.

As noted, in accordance with implementations of the disclosure, energetic deuterium atoms can be generated in a deuterium ($D_2$) plasma under appropriate conditions. One mechanism for generation of energetic deuterium atoms (also known as "hot" deuterium atoms) involves vibrational excitation from electron impacts in the plasma.

Vibrational excitation can be characterized per below, where e is an electron, and v is the vibrational state of the $D_2$ molecule:

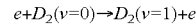
$$e+D_2(v=0) \rightarrow D_2(v=1)+e$$

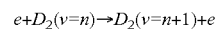
$$e+D_2(v=n) \rightarrow D_2(v=n+1)+e$$

As shown above, the deuterium molecules can acquire higher vibrational states as a result of electron impacts.

Further electron impacts can produce cleavage of the deuterium molecule, resulting in two energetic deuterium atoms, as shown below, where $D^{**}$ is an energetic deuterium atom:

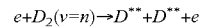
$$e+D_2(v=n) \rightarrow D^{}+D^{}+e$$

As shown above, the energetic deuterium atoms may receive equal energy from the vibrationally excited parent molecule.

Another mechanism for generation of energetic deuterium atoms involves charge exchange reactions resulting from collisions with ions. Several charge exchange reactions can lead to energetic deuterium formation. For example, charge exchange reactions between deuterium molecules can produce energetic deuterium, such as that shown below:

$$D_2(v=n)+D_2^+ \rightarrow D_2(v=n)^{**}+D_2^+$$

In the above reaction, a vibrationally excited deuterium molecule collides with a $D_2^+$ ion, transferring an electron and imparting vibrational excitation and energy to generate an energetic and vibrationally excited deuterium molecule.

An alternative mechanism is shown below:

$$D_2(v=n)+D_2^+ \rightarrow D^{**}+D_3^+$$

In the above reaction, rather than electron transfer as in the previous reaction, a deuterium ion is transferred from the molecular ion to the vibrationally excited deuterium, and the remaining deuterium atom is imparted with energy to generate the energetic deuterium atom.

In other charge exchange reactions, deuterium atoms and deuterium molecules may collide, resulting in generation of energetic deuterium. An example is shown below:

$$D+D_2^+ \rightarrow D_2(v=n)^{**}+D^+$$

In the above reaction, a deuterium atom collides with a molecular $D_2^+$ ion, transferring an electron and imparting vibrational excitation and energy to generate an energetic and vibrationally excited deuterium molecule.

Another example of collision between a deuterium atom and a deuterium molecule is shown below:

$$D_2(v=n)+D^+ \rightarrow D^{**}+D_2^+$$

In the above reaction, a vibrationally excited deuterium molecule collides with an atomic deuterium ion, imparting energy to generate an energetic deuterium atom as the charge is transferred to the deuterium molecule.

In still other types of reactions, deuterium atoms colliding with one another may produce energetic deuterium, as in accordance with the reaction shown below:

$$D+D^+ \rightarrow D^{**}+D^+$$

In the above reaction, a neutral deuterium atom collides with an atomic deuterium ion, generating an energetic neutral deuterium atom from the ion, as the charge is transferred converting the neutral to an ion.

Reactions to generate energetic deuterium, such as those described above, can be produced in a $D_2$ plasma under appropriate conditions, including under low bias power (e.g. $W_b<100$ W) and low pressure (e.g. <100 mTorr). Under such conditions of low bias power and low pressure in a deuterium plasma, not a lot of energy is imparted to the ions, so that the neutrals will become energetic to a greater extent and the neutrals will primarily perform the work of etching.

Utilizing the above principles involving vibrational excitation, an example of energetic deuterium generation through vibrational excitation may help illustrate principles in accordance with implementations of the disclosure. FIG. 1 is a graph conceptually illustrating potential energy versus intermolecular distance for a deuterium molecule $D_2$. By way of example several vibrational states are shown (e.g. v=0, 1, 2, 3, etc.). For a deuterium molecule $D_2$, proceeding from the ground state v=0, each additional vibrational state requires approximately 0.3 eV. So in a plasma with 0.3 eV energy electrons, such electrons impart energy to the deuterium molecule and enable it to climb vibrational states, with each unit step up in vibrational state requiring 0.3 eV. Eventually, the deuterium molecule may have a high enough vibrational state, wherein another electron may produce an unstable state, leading to splitting of the vibrationally excited deuterium molecule into two energetic deuterium atoms, as shown below:

$$E+D_2(v=n) \rightarrow D^{}+D^{}+e$$

By way of example without limitation, a deuterium molecule may reach a vibrational state of v=6. As each vibrational excitation step requires approximately 0.3 eV of energy, then the vibrationally excited deuterium molecule at v=6 will have approximately 6*0.3 eV=1.8 eV of energy. And when the deuterium molecule splits, each energetic deuterium atom will have approximately 0.9 eV of energy. It will be appreciated that this is simply an example of hot deuterium atom generation by vibrational excitation, demonstrating principles in accordance with implementations of the disclosure.

Under conditions of low pressure and low bias, so that ions don't have much energy, etching can be achieved primarily using neutrals. Energetic deuterium can be generated through vibrational excitation (e.g. at a vibrational state of v=10 for a $D_2$ molecule, hot D gets 1.5 eV), and through charge exchange reactions, in which an electron can be donated from a neutral to an ion, making the ion an energetic neutral. Further, ions may transfer energy to neutrals, e.g. a $D^+$ ion may strike $D_2+$ with 30 eV bias, and split up the energy. This can be achieved under continuous TCP conditions in some implementations. It will be appreciated that there are still ions in the plasma, but through charge exchange the ions are employed to produce hot deuterium. Furthermore, because the process is operated under low bias (e.g. 5-100 W), the ions will have low energy and consequently will not etch the substrate surface. Ions may give energy to neutrals, but the ions do not etch. Instead, the neutrals are performing the work of etching as described further herein.

Additional details regarding dissociation of diatomic molecules can be found with reference to Thorman et al., "The role of low-energy electrons in focused electron beam induced deposition: four case studies of representative precursors," Beilstein J. Nanotechnol. 2015, 6, 1904-1926, the disclosure of which is incorporated by reference herein.

FIG. 1 is a graph illustrating energy versus angle for a deuterium plasma, in accordance with implementations of the disclosure. In the illustrated implementation, plasma is generated at approximately 10 mTorr and approximately 300 W TCP. The various bands indicate different densities of energy distribution. Broadly speaking, the energy is as high as approximately 30 eV. Furthermore, the plot shows greater density at lower energies, e.g. energies less than approximately 5 eV. The illustrated energy distribution for these plasma reactions provides an ample supply of energized particles that are useful for reactions that generate energetic deuterium.

It will be appreciated that if the pressure is too high, there will be lots of collisions between particles, and all particles will get a portion of energy so that the average energy becomes very small. This would drive down the distribution of energies to lower energies. Therefore, in accordance with implementations of the disclosure, to help ensure a sufficient distribution of energies for hot deuterium generation, the deuterium plasma is generated under low pressure conditions. For example, in some implementations the pressure is in the range of approximately 1 to 100 mTorr; in some implementations, approximately 1 to 50 mTorr. In some implementations the pressure is in the range of approximately 10 to 30 mTorr. In some implementations the pressure is approximately 20 mTorr.

In some implementations low TCP power is applied. In some implementations TCP power is approximately less than 100 W.

In some implementations low bias power is applied. In some implementations bias power is approximately less than 100 W.

Figure 2:
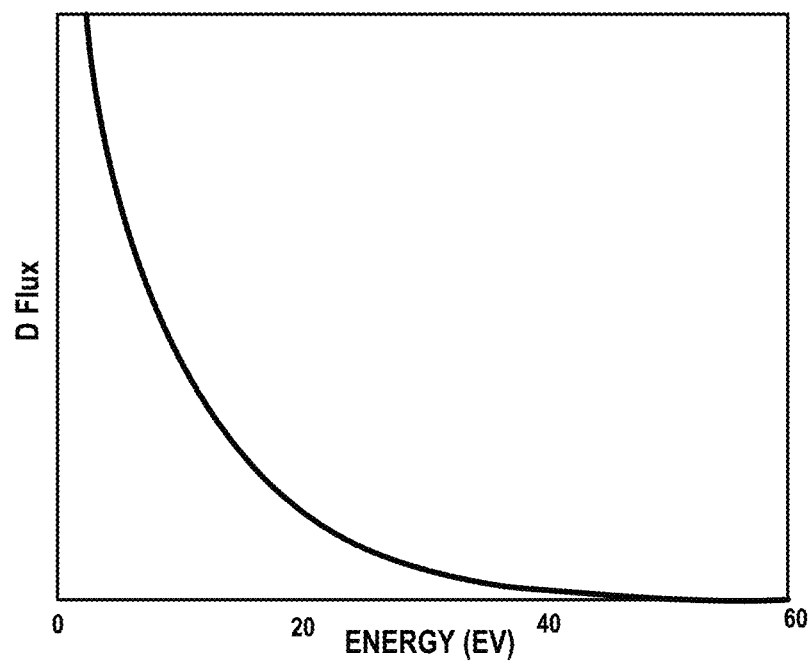
FIG. 2 is a graph illustrating deuterium flux versus energy (eV), in accordance with implementations of the disclosure.

FIG. 2 is a graph illustrating deuterium flux versus energy (eV), in accordance with implementations of the disclosure. As can be seen, there is generally decreasing deuterium flux as energy increases, such that the flux is more concentrated at lower energies. Between 40 and 60 eV, the deuterium flux essentially falls to zero.

FIGS. 3A-3D conceptually illustrate a series of reactions through which energetic deuterium achieves etching of the surface of a substrate, in accordance with implementations of the disclosure.

Figure 3A:
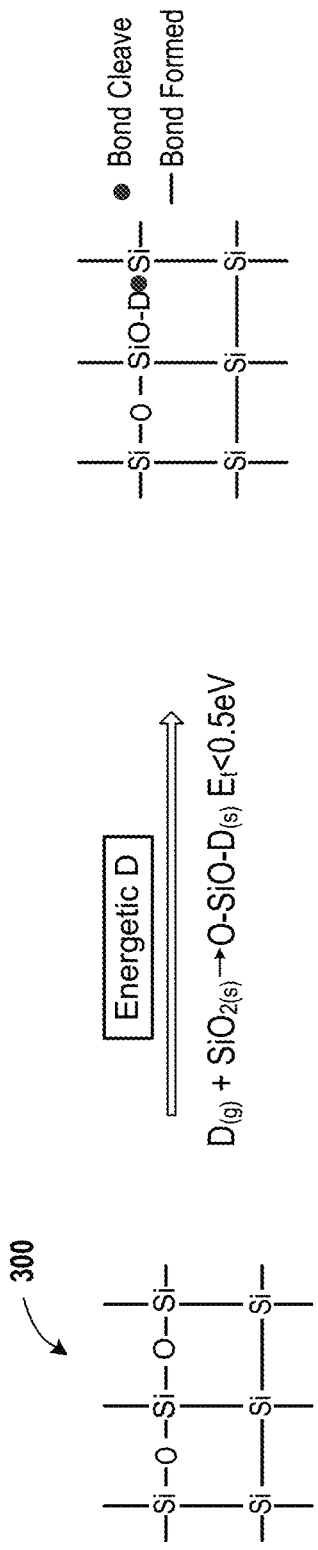
Figure 3B:
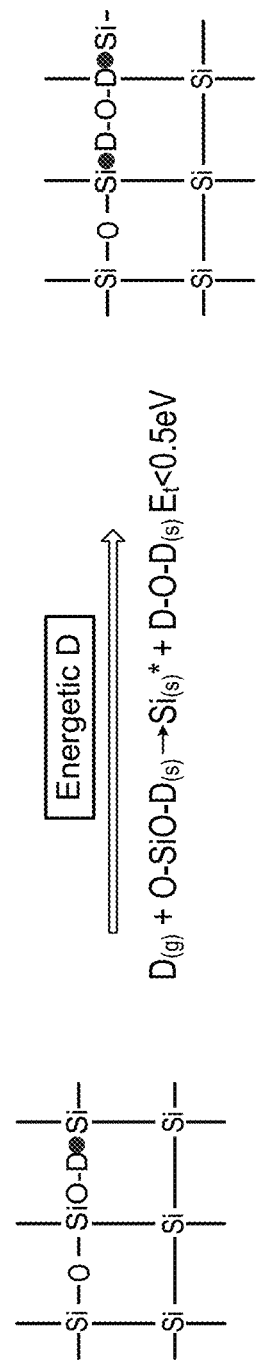

At FIG. 3A, a substrate surface 300 is shown, having silicon dioxide on the exposed surface. An energetic D having 0.5 eV will break a Si—O bond, and replace the Si, forming a bond between the D and the O. At FIG. 3B, this process may repeat for the other Si—O bond of the oxygen, resulting in solid phase D-O-D.

At FIG. 3C, the solid phase D-O-D is split by additional hot D atoms. For example, another hot D at 3.5 eV yields $D_2$ gas+O-D (solid phase). And another hot D at 3.5 eV yields $D_2$ gas+$O_2$ gas. In this manner, the oxygen is removed from the silicon dioxide layer.

In some implementations a hot D at 1.4 eV may form Si-D on the surface. However, a hot D at 2.8 eV will attack Si-D, and liberate Si, and remove the D as $D_2$ gas.

In some implementations, some silicon from the $SiO_2$ may be left behind on the surface. However it will be appreciated that at a 3 nm process, the $SiO_2$ is so thin (e.g. 0.5 nm); so adding some silicon from this thin layer is not consequential. That is, the Si from SiO2 is minimal and may become attached to the silicon layer underneath. And thus, the etched material can be primarily oxygen in some implementations.

In some implementations, after oxygen is removed from the $SiO_2$, the remaining silicon can be removed as $SiD_4$ gas. That is, when the oxygen is removed from the $SiO_2$, deuterium may form bonds with the Si at the available sites. Further, the remaining bond of the Si (to another Si) is made more accessible, and can be broken by, for example, a D+ ion (e.g. at about 20 eV). In this manner $SiD_4$ gas is formed, which leaves the surface, carrying away the Si from the original $SiO_2$ layer.

In accordance with implementations of the disclosure, etching is performed under low bias power (e.g. <100 W in some implementations, or <50 W in some implementations). Thus, the ions have low energy and cannot directly etch the silicon layer and break Si—Si bonds because they are interlinked. However, once the oxygen from the surface $SiO_2$ is removed as previously described, the remaining silicon atoms at the surface are susceptible because they are no longer interlinked, and thus the low energy ions are capable of removing such silicon, e.g. by accessing the Si—Si bond and forming volatile products such as $SiD_4$ gas.

By contrast, the silicon atoms in the underlying silicon layer are interlinked (cross linked) and therefore not very accessible, such that deuterium will not penetrate and break bonds.

FIGS. 4A-4C conceptually illustrate selective etching of $SiO_2$ from a substrate surface, in accordance with implementations of the disclosure. FIG. 4A conceptually illustrates a cross section of a portion of a substrate surface 400, prior to initiation of an etch process. In the illustrated implementation, silicon dioxide portions 402 and 404 are present at the surface of the substrate, and are present on an underlying silicon portion 406.

FIG. 4B illustrates the substrate surface 400 during a selective etch process in accordance with implementations of the disclosure. The etch process is configured to selectively etch the $SiO_2$ while leaving the underlying silicon portion 406 intact. As shown in the illustrated implementation, the $SiO_2$ portions 402 and 404 have been partially and selectively removed from the substrate surface 400. As the etch process proceeds, $SiD_4$, $D_2$ and O gases are evolved from the surface and removed from the process chamber.

FIG. 4C illustrates the substrate surface 400 after performance of the selective etch process. As shown, the $SiO_2$ portions have been removed, while the underlying silicon portion 406 has remained intact.

As discussed in accordance with implementations of the disclosure, energetic D atoms can separate Si from O atoms in $SiO_2$, forming O-D bonds. Later on another D atom can cause scission of a remaining Si—O bond. Successive D atoms can remove O producing $D_2$(g) and O(g). D atoms can form Si-D bonds but energetic D can release bonded D forming $D_2$(g) protecting Si. Energetic D because of its selective interaction with $SiO_2$ can enable feature etching of $SiO_2$ without harming Si below, when pressure is kept low and small bias power is used. The low pressure, low bias power $D_2$ plasma can generate hot D atoms responsible for removing $SiO_2$ above Si selectively, which is not possible using traditional plasma methods such as $C_4F_8$ plasma application.

Figure 5:
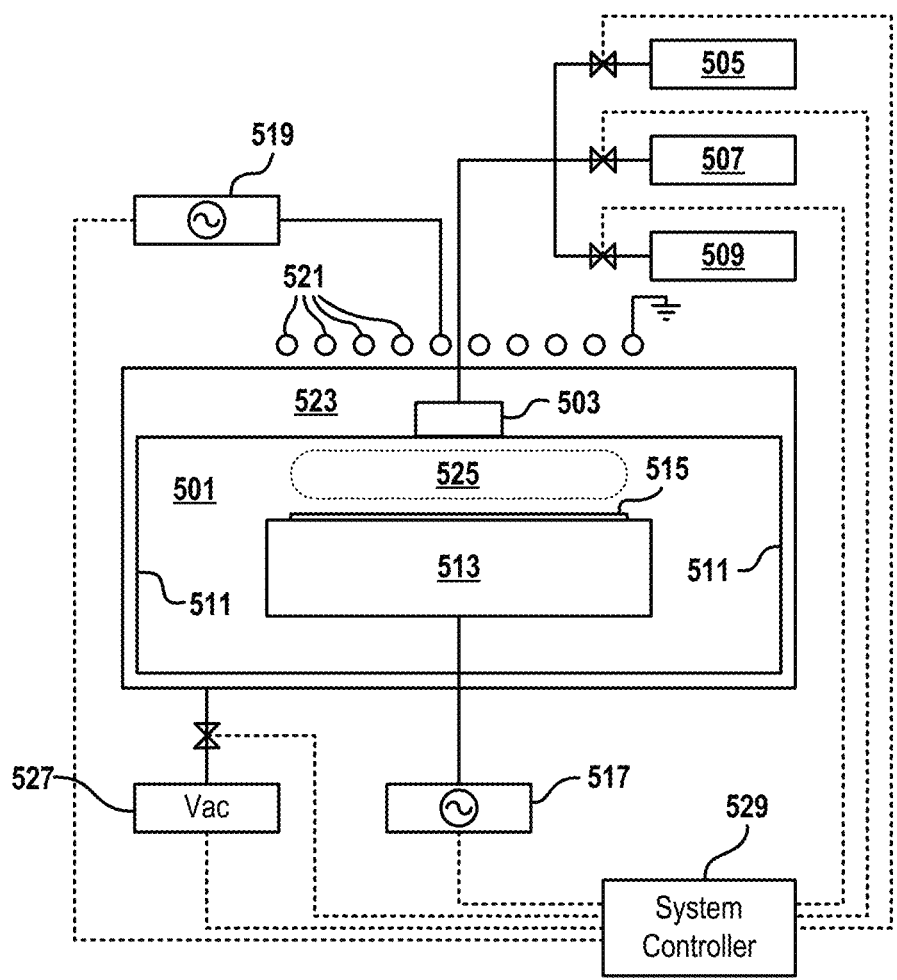
FIG. 5 illustrates an example ICP deposition system, in accordance with implementations of the disclosure.

Various implementations described herein may be performed in an inductively coupled plasma (ICP) system. With reference to FIG. 5, an example ICP deposition system or apparatus may include a chamber 501 having a gas injector/showerhead/nozzle 503 for distributing gases (505, 507, 509) (e.g. reactant and purge gases) or other chemistries into the chamber 501, chamber walls 511, a chuck 513 for holding a substrate or wafer 515 to be processed which may include electrostatic electrodes for chucking and dechucking a wafer. The chuck 513 is heated for thermal control, enabling heating of the substrate 515 to a desired temperature. In some implementations, the chuck 513 may be electrically charged using an RF power supply 517 to provide a bias voltage in accordance with implementations of the disclosure.

An RF power supply 519 is configured to supply power to an RF antenna/coil 521, disposed over a dielectric window 523 to generate a plasma 525 in the process space over the substrate 515. In some implementations, the chamber walls are heated to support thermal management and efficiency. A vacuum source 527 provides a vacuum to evacuate gases from the chamber 501. The system or apparatus may include a system controller 529 for controlling some or all of the operations of the chamber or apparatus such as modulating the chamber pressure, inert gas flow, plasma power, plasma frequency, reactive gas flow; bias power, temperature, vacuum settings; and other process conditions.

In some implementations, a system/apparatus may include more than one chamber for processing substrates.

Figure 6:
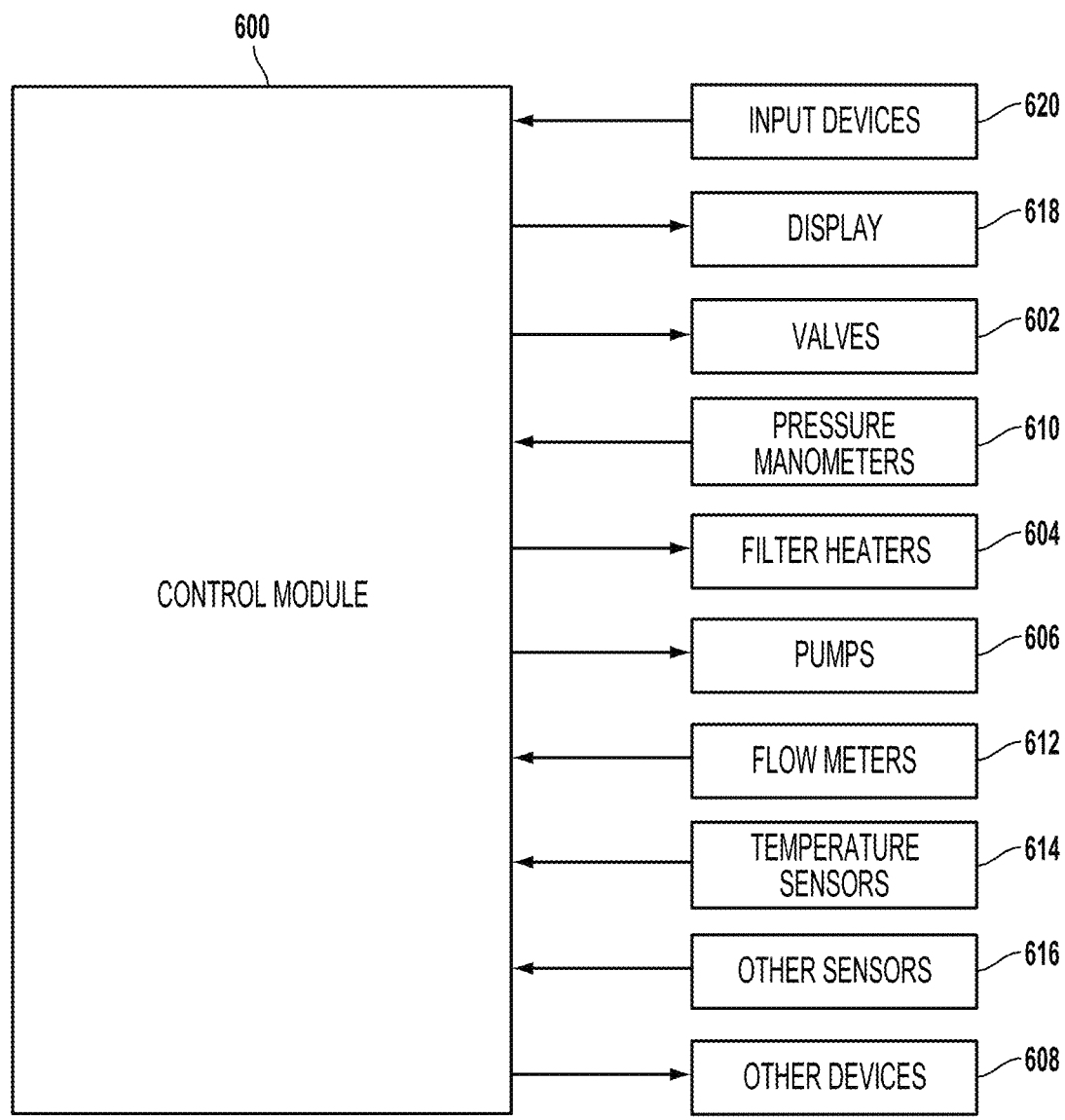
FIG. 6 shows a control module for controlling the systems described above, in accordance with implementations of the disclosure.

FIG. 6 shows a control module 600 for controlling the systems described above, in accordance with implementations of the disclosure. For instance, the control module 600 may include a processor, memory and one or more interfaces. The control module 600 may be employed to control devices in the system based in part on sensed values. For example, the control module 600 may control one or more of valves 602, filter heaters 604, pumps 606, and other devices 608 based on the sensed values and other control parameters. The control module 600 receives the sensed values from, for example only, pressure manometers 610, flow meters 612, temperature sensors 614, and/or other sensors 616. The control module 600 may also be employed to control process conditions during reactant delivery and plasma processing. The control module 600 will typically include one or more memory devices and one or more processors.

The control module 600 may control activities of the reactant delivery system and plasma processing apparatus. The control module 600 executes computer programs including sets of instructions for controlling process timing, delivery system temperature, pressure differentials across the filters, valve positions, mixture of gases, chamber pressure, chamber temperature, wafer temperature, RF power levels, wafer ESC or pedestal position, and other parameters of a particular process. The control module 600 may also monitor the pressure differential and automatically switch vapor reactant delivery from one or more paths to one or more other paths. Other computer programs stored on memory devices associated with the control module 600 may be employed in some implementations.

Typically there will be a user interface associated with the control module 600. The user interface may include a display 618 (e.g. a display screen and/or graphical software displays of the apparatus and/or process conditions), and user input devices 620 such as pointing devices, keyboards, touch screens, microphones, etc.

Computer programs for controlling delivery of reactant, plasma processing and other processes in a process sequence can be written in any conventional computer readable programming language: for example, assembly language, C, C++, Pascal, Fortran or others. Compiled object code or script is executed by the processor to perform the tasks identified in the program.

The control module parameters relate to process conditions such as, for example, filter pressure differentials, process gas composition and flow rates, temperature, pressure, plasma conditions such as RF power levels and the RF frequency, cooling gas pressure, and chamber wall temperature.

The system software may be designed or configured in many different ways. For example, various chamber component subroutines or control objects may be written to control operation of the chamber components necessary to carry out the inventive deposition processes. Examples of programs or sections of programs for this purpose include substrate positioning code, process gas control code, pressure control code, heater control code, and plasma control code.

Although the foregoing implementations have been described in some detail for purposes of clarity of understanding, it will be apparent that certain changes and modifications may be practiced within the scope of the disclosed implementations. It should be noted that there are many alternative ways of implementing the processes, systems, and apparatus of the present implementations. Accordingly, the present implementations are to be considered as illustrative and not restrictive, and the implementations are not to be limited to the details given herein.

The invention claimed is:

1. A method, comprising:
   generating a deuterium plasma, the deuterium plasma including a plurality of energetic neutral deuterium atoms; and
   directing one or more of the plurality of energetic neutral deuterium atoms to a surface of a substrate, the surface of the substrate having a region of silicon dioxide, the region of silicon dioxide having an underlying silicon layer;
   wherein the one or more of the plurality of energetic neutral deuterium atoms selectively etch the region of silicon dioxide, to the exclusion of exposed surfaces of the underlying silicon layer.

2. The method of claim 1, wherein at least some of the energetic neutral deuterium atoms are generated from vibrational excitation during electron impact in the deuterium plasma.

3. The method of claim 1, wherein at least some of the energetic neutral deuterium atoms are generated from charge exchange collisions in the deuterium plasma.

4. The method of claim 1, wherein the plurality of energetic neutral deuterium atoms are generated with approximately 0.15 to 30 eV energy.

5. The method of claim 1, wherein generating the deuterium plasma includes introducing a deuterium gas into a process chamber in which the substrate is disposed, and inductively coupling power into the deuterium gas in the process chamber.

6. The method of claim 5, wherein generating the deuterium plasma and directing the one or more of the plurality of energetic neutral deuterium atoms are performed in the process chamber at a pressure of approximately 1 to 50 mTorr.

7. The method of claim 5, wherein inductively coupling power into the deuterium gas in the process chamber includes applying power to an RF coil at approximately 50 to 5000 Watts.

8. The method of claim 1, wherein directing the one or more of the plurality of energetic neutral deuterium atoms to the surface of the substrate includes applying a bias power of approximately 5 to 100 Watts.

9. A method, comprising:
   generating a deuterium plasma, the deuterium plasma including a plurality of energetic neutral deuterium atoms; and
   directing one or more of the plurality of energetic neutral deuterium atoms to a surface of a substrate, the surface of the substrate having a region of silicon dioxide, the region of silicon dioxide having an underlying silicon layer;
   wherein directing the one or more of the plurality of energetic neutral deuterium atoms to the surface of the substrate includes applying a bias power of approximately 5 to 100 Watts;
   wherein generating the deuterium plasma and directing the one or more of the plurality of energetic neutral deuterium atoms are performed in the process chamber at a pressure of approximately 1 to 50 mTorr;
   wherein the one or more of the plurality of energetic neutral deuterium atoms selectively etch the region of silicon dioxide, to the exclusion of exposed surfaces of the underlying silicon layer.

10. The method of claim 9, wherein the energetic neutral deuterium atoms are generated from vibrational excitation during electron impact or charge exchange collisions in the deuterium plasma.

11. The method of claim 9, wherein the plurality of energetic neutral deuterium atoms are generated with approximately 0.15 to 30 eV energy.

12. The method of claim 9, wherein generating the deuterium plasma includes introducing a deuterium gas into a process chamber in which the substrate is disposed, and inductively coupling power into the deuterium gas in the process chamber.

13. The method of claim 12, wherein inductively coupling power into the deuterium gas in the process chamber includes applying power to an RF coil at approximately 50 to 5000 Watts.

\* \* \* \* \*